United States Patent
Takahashi et al.

(10) Patent No.: US 11,203,220 B2
(45) Date of Patent: Dec. 21, 2021

(54) INK, PRINTING APPARATUS, PRINTING METHOD, MANUFACTURING METHOD FOR SHAPED OBJECT, AND THERMAL EXPANSION SHEET

(71) Applicant: CASIO COMPUTER CO., LTD., Tokyo (JP)

(72) Inventors: Hideki Takahashi, Ome (JP); Yuji Horiuchi, Higashiyamato (JP); Yoshimune Motoyanagi, Hamura (JP); Satoshi Mitsui, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 709 days.

(21) Appl. No.: 15/934,200

(22) Filed: Mar. 23, 2018

(65) Prior Publication Data
US 2018/0274087 A1   Sep. 27, 2018

(30) Foreign Application Priority Data

Mar. 24, 2017 (JP) .............................. JP2017-059401
Feb. 22, 2018 (JP) .............................. JP2018-029583
Mar. 8, 2018 (JP) .............................. JP2018-041457

(51) Int. Cl.
| | |
|---|---|
| *B41M 5/46* | (2006.01) |
| *B41M 5/41* | (2006.01) |
| *C09D 11/037* | (2014.01) |
| *B41M 3/00* | (2006.01) |
| *C09D 11/322* | (2014.01) |

(Continued)

(52) U.S. Cl.
CPC ............ *B41M 5/465* (2013.01); *B41J 11/002* (2013.01); *B41M 3/00* (2013.01); *B41M 3/06* (2013.01); *B41M 5/26* (2013.01); *B41M 5/41* (2013.01); *B41M 7/009* (2013.01); *C09D 11/037* (2013.01); *C09D 11/322* (2013.01); *C09D 11/38* (2013.01); *C23C 16/0209* (2013.01); *B41M 3/16* (2013.01)

(58) Field of Classification Search
CPC .......... B41M 5/465; B41M 3/06; B41M 5/26; B41M 7/009; B41J 11/002; C23C 16/0209
See application file for complete search history.

(56) References Cited

U.S. PATENT DOCUMENTS

| | | |
|---|---|---|
| 5,122,430 A | 6/1992 | Nishitsuji et al. |
| 5,846,622 A | 12/1998 | Imaeda |

(Continued)

FOREIGN PATENT DOCUMENTS

| | | |
|---|---|---|
| DE | 102008049595 A1 | 4/2010 |
| EP | 0376322 A2 | 7/1990 |

(Continued)

OTHER PUBLICATIONS

Han et al. Nanoscale Research Letters 2011,6:457. (Year: 2011).*

(Continued)

*Primary Examiner* — Michael M. Robinson
(74) *Attorney, Agent, or Firm* — Holtz, Holtz & Volek PC

(57) ABSTRACT

An ink for forming a photothermal conversion layer used to cause at least a portion of a thermal expansion layer of a thermal expansion sheet to swell. The ink includes an inorganic infrared absorbing agent having a higher absorptivity in at least one region of the infrared light spectrum than in the visible light spectrum.

9 Claims, 11 Drawing Sheets

(51) Int. Cl.
*C09D 11/38* (2014.01)
*B41J 11/00* (2006.01)
*B41M 3/06* (2006.01)
*B41M 5/26* (2006.01)
*B41M 7/00* (2006.01)
*C23C 16/02* (2006.01)
*B41M 3/16* (2006.01)

(56) References Cited

U.S. PATENT DOCUMENTS

| | | |
|---|---|---|
| 6,319,613 B1 | 11/2001 | Takeda et al. |
| 7,802,881 B2 | 9/2010 | Sadohara |
| 8,007,578 B2 | 8/2011 | Bhatt |
| 8,080,307 B2 | 12/2011 | Demartin et al. |
| 8,157,905 B2 | 4/2012 | Lewis et al. |
| 8,362,130 B2 | 1/2013 | Demartin et al. |
| 8,888,241 B2 | 11/2014 | Tabayashi |
| 9,579,833 B2 | 2/2017 | Horiuchi |
| 9,663,675 B2 | 5/2017 | Jarvis |
| 10,005,208 B2 | 6/2018 | Horiuchi |
| 10,414,076 B2 | 9/2019 | Horiuchi |
| 2005/0203233 A1 | 9/2005 | Fugiel et al. |
| 2006/0216485 A1 | 9/2006 | Lin et al. |
| 2007/0082963 A1 | 4/2007 | Bhatt |
| 2007/0256782 A1 | 11/2007 | Haldeman et al. |
| 2008/0241492 A1 | 10/2008 | Demartin et al. |
| 2009/0115826 A1 | 5/2009 | Sadohara |
| 2009/0202753 A1 | 8/2009 | Teramae et al. |
| 2010/0059691 A1 | 3/2010 | Lewis et al. |
| 2010/0080579 A1 | 4/2010 | Yamaguchi et al. |
| 2010/0080580 A1 | 4/2010 | Yamaguchi et al. |
| 2011/0206429 A1 | 8/2011 | Terao et al. |
| 2011/0243629 A1 | 10/2011 | Roberts et al. |
| 2012/0065313 A1 | 3/2012 | Demartin et al. |
| 2013/0065979 A1 | 3/2013 | Kummet et al. |
| 2013/0161874 A1 | 6/2013 | Horiuchi |
| 2013/0229478 A1* | 9/2013 | Horiuchi ............... B41M 7/009 347/188 |
| 2015/0343796 A1* | 12/2015 | Ohnishi ............... B41J 11/002 347/102 |
| 2016/0168407 A1 | 6/2016 | Jarvis |
| 2017/0144339 A1 | 5/2017 | Horiuchi |
| 2018/0015772 A1 | 1/2018 | Okada et al. |
| 2018/0264692 A1 | 9/2018 | Horiuchi |
| 2018/0272781 A1 | 9/2018 | Takahashi et al. |
| 2019/0033743 A1 | 1/2019 | Azzam et al. |
| 2019/0263170 A1 | 8/2019 | Okada et al. |
| 2019/0329577 A1 | 10/2019 | Takahashi et al. |
| 2020/0086668 A1 | 3/2020 | Fujita et al. |

FOREIGN PATENT DOCUMENTS

| | | |
|---|---|---|
| EP | 1008564 A1 | 6/2000 |
| EP | 1790701 A1 | 5/2007 |
| EP | 1954768 A1 | 8/2008 |
| GB | 2516773 A | 2/2015 |
| JP | 64028660 A | 1/1989 |
| JP | H09207428 A | 8/1997 |
| JP | 2001150812 A | 6/2001 |
| JP | 2002067509 A | 3/2002 |
| JP | 2003089275 A | 3/2003 |
| JP | 2004168842 A | 6/2004 |
| JP | 2005187323 A | 7/2005 |
| JP | 2006212991 A | 8/2006 |
| JP | 2006220740 A | 8/2006 |
| JP | 2010076132 A | 4/2010 |
| JP | 2013097211 A | 5/2013 |
| JP | 2013132765 A | 7/2013 |
| JP | 2014168851 A | 9/2014 |
| JP | 2015117353 A | 6/2015 |
| JP | 2016009634 A | 1/2016 |
| JP | 2016125829 A | 7/2016 |
| JP | 2016162500 A | 9/2016 |
| JP | 2016199715 A | 12/2016 |
| WO | 2007132214 A1 | 11/2007 |
| WO | 2015015200 A1 | 2/2015 |
| WO | 2016121842 A1 | 8/2016 |
| WO | 2016167298 A1 | 10/2016 |

OTHER PUBLICATIONS

Japanese Office Action dated Oct. 29, 2019 (and English translation thereof) issued in Japanese Patent Application No. 2018-029583.
Japanese Office Action dated Oct. 29, 2019 (and English translation thereof) issued in Japanese Patent Application No. 2018-041457.
Chinese Office Action dated Sep. 17, 2019 (and English translation thereof) issued in Chinese Application No. 201810249480.3.
Office Action (Non-Final Rejection) dated Sep. 24, 2020 issued in related U.S. Appl. No. 15/934,371.
Office Action (Non-Final Rejection) dated Nov. 10, 2020 issued in U.S. Appl. No. 16/389,521.
Related U.S. Appl. No. 16/389,521, filed Apr. 19, 2019, Title: "Thermally Expandable Sheet", First Named Inventor: Hideki Takahashi.
Related U.S. Appl. No. 15/934,371, filed Mar. 23, 2018, Title: "Ink, Thermal Expansion Shfft, Manufacturing Method for Shaped Object, Printing Apparatus, and Printing Method;" First Named Inventor: Hideki Takahashi.
European Office Action dated Oct. 27, 2020 issued in European Application No. 18163665.5.
Partial European Search Report dated Aug. 27, 2018 issued in counterpart European Application No. 18163665.5.
Japanese Office Action (and English language translation thereof) dated May 12, 2020 issued in Japanese Application No. 2018-029583.
Japanese Office Action (and English language translation thereof) dated May 12, 2020 issued in Japanese Application No. 2018-041457.

* cited by examiner

INK, PRINTING APPARATUS, PRINTING METHOD, MANUFACTURING METHOD FOR SHAPED OBJECT, AND THERMAL EXPANSION SHEET

CROSS-REFERENCE TO RELATED APPLICATION

This application claims the benefit of Japanese Patent Application No. 2017-059401, filed on Mar. 24, 2017, Japanese Patent Application No. 2018-029583, filed on Feb. 22, 2018, and Japanese Patent Application No. 2018-041457, filed on Mar. 8, 2018, of which the entirety of the disclosures is incorporated by reference herein.

FIELD

This application relates generally to an ink, and more particularly to an ink for forming a photothermal conversion layer for causing a part or all of a thermal expansion sheet, which foams and swells in accordance with the amount of absorbed heat, to swell, a printing apparatus, a printing method, a manufacturing method for a shaped object, and a thermal expansion sheet.

BACKGROUND

In the related art, there are thermal expansion sheets obtained by forming a thermal expansion layer including a thermally expandable material on one surface of a base sheet. This thermally expandable material foams and swells in accordance with the amount of absorbed heat. By forming a photothermal conversion layer that converts light to heat on the thermal expansion sheet and irradiating the photothermal conversion layer with light, part or all the thermal expansion layer can be made to swell. Additionally, methods are known in the related art for forming a pseudo-three-dimensional shaped object (pseudo-three-dimensional image) on a thermal expansion sheet by changing the shape of the photothermal conversion layer (see, for example, JP-A-S64-28660 and JP-A-2001-150812).

Photothermal conversion layers are typically formed using black ink containing carbon. However, in some cases, the black ink used to print the photothermal conversion layer affects the color of the resulting pseudo-three-dimensional image. For example, when the photothermal conversion layer is formed on the surface of a thermal expansion sheet and a color image is printed on the photothermal conversion layer using color ink, the color image may be dulled by the black ink of the photothermal conversion layer. Moreover, the color of the photothermal conversion layer appears as-is in the region of the surface of the thermal expansion sheet where the photothermal conversion layer is to be formed and swelling is intended occur.

Therefore, there is a need for an ink, a printing apparatus, a printing method, and a manufacturing method for a shaped object whereby a photothermal conversion layer having suppressed color can be formed, thereby reducing the effects of the photothermal conversion layer on the color of the pseudo-three-dimensional image (shaped object).

In light of the state of the art, an object of this application is to provide an ink for forming a photothermal conversion layer having suppressed color, and a printing apparatus, a printing method, a manufacturing method for a shaped object, and a thermal expansion sheet using this ink.

SUMMARY

An aspect of this application is an ink for forming a photothermal conversion layer used for causing expansion of at least a portion of a thermal expansion layer of a thermal expansion sheet. The ink includes an inorganic infrared absorbing agent having a higher absorptivity in at least one region of the infrared light spectrum than in the visible light spectrum.

Another aspect of this application is a printing apparatus for printing a photothermal conversion layer used for causing expansion of at least a portion of a thermal expansion layer of a thermal expansion sheet. The printing apparatus prints the photothermal conversion layer on at least one of a first face or a second face of the thermal expansion sheet using an ink including an inorganic infrared absorbing agent having a higher absorptivity in at least one region of the infrared light spectrum than in the visible light spectrum.

Another aspect of this application is a printing method for printing a photothermal conversion layer used for causing expansion of at least a portion of a thermal expansion layer of a thermal expansion sheet. The printing method includes printing the photothermal conversion layer on at least one of a first face or a second face of the thermal expansion sheet using an ink including an inorganic infrared absorbing agent having a higher absorptivity in at least one region of the infrared light spectrum than in the visible light spectrum.

Another aspect of this application is a manufacturing method for manufacturing a shaped object by using a photothermal conversion layer for causing expansion of at least a portion of a thermal expansion layer of a thermal expansion sheet. The method includes forming the photothermal conversion layer on at least one of a first face or a second face of the thermal expansion sheet using an ink including an inorganic infrared absorbing agent having a higher absorptivity in at least one region of the infrared light spectrum than in the visible light spectrum.

Another aspect of this application is a thermal expansion sheet including a thermal expansion layer that swells due to heat; and a photothermal conversion layer for causing expansion of the thermal expansion layer. In this thermal expansion sheet, the photothermal conversion layer includes an inorganic infrared absorbing agent having a higher absorptivity in at least one region of the infrared light spectrum than in the visible light spectrum.

BRIEF DESCRIPTION OF DRAWINGS

A more complete understanding of this application can be obtained when the following detailed description is considered in conjunction with the following drawings, in which.

DETAILED DESCRIPTION

Figure 4A:
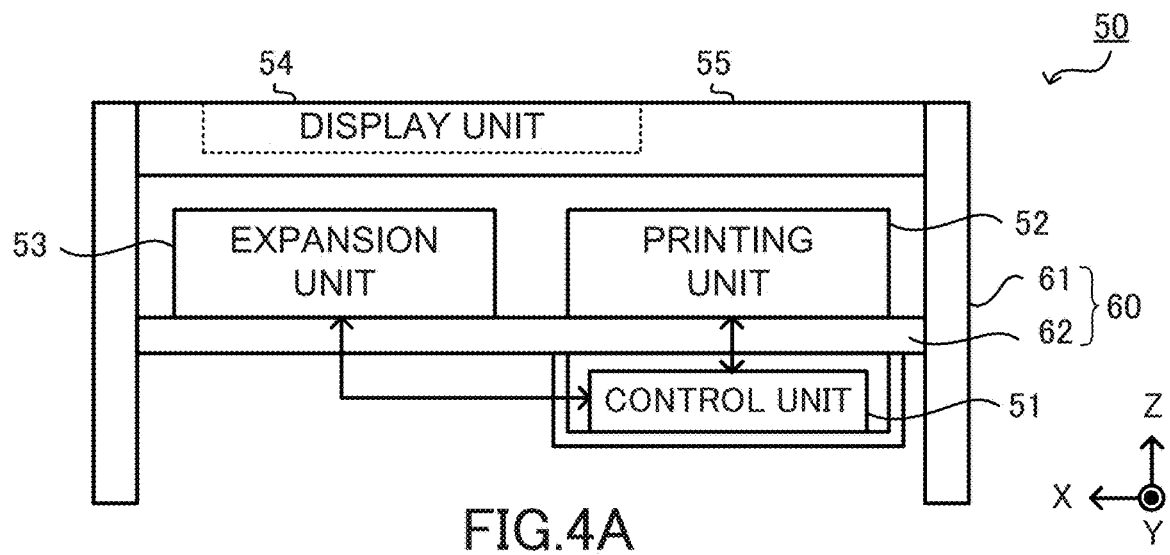
FIG. 4A is a drawing illustrating an overview of a pseudo-three-dimensional image forming unit according to the embodiment.
Figure 4B:
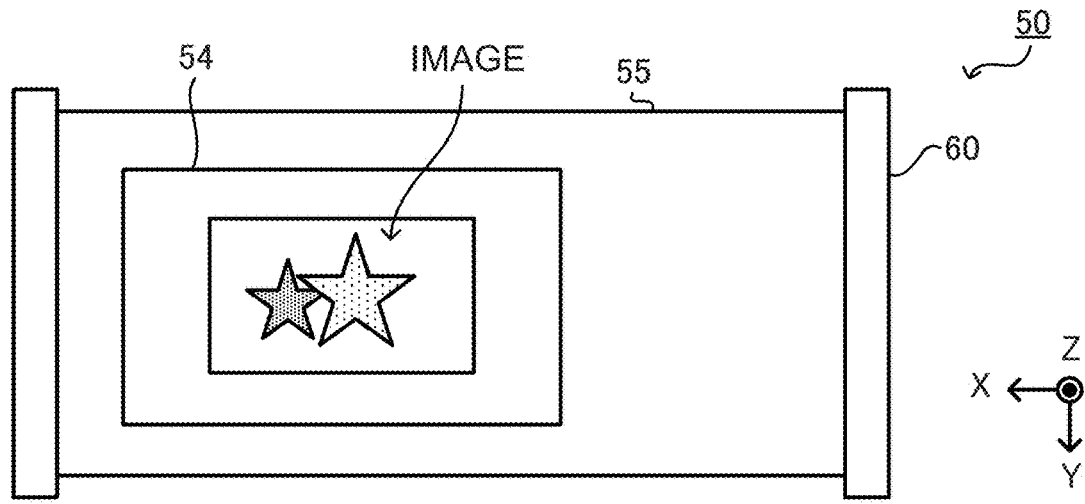
FIG. 4B is a drawing illustrating an overview of a pseudo-three-dimensional image forming unit according to the embodiment.
Figure 4C:
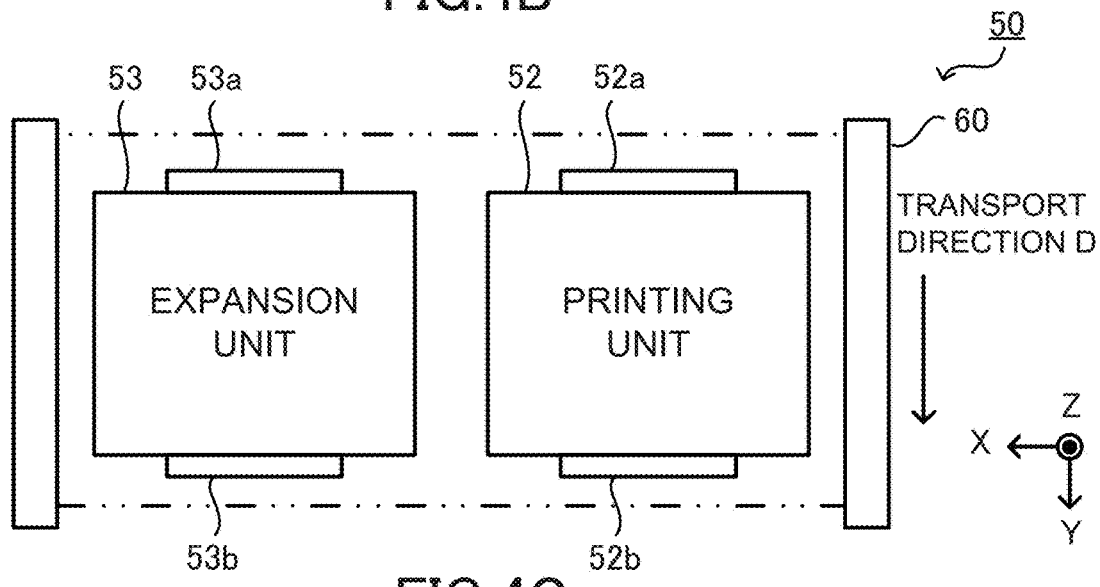
FIG. 4C is a drawing illustrating an overview of a pseudo-three-dimensional image forming unit according to the embodiment.
Figure 5:
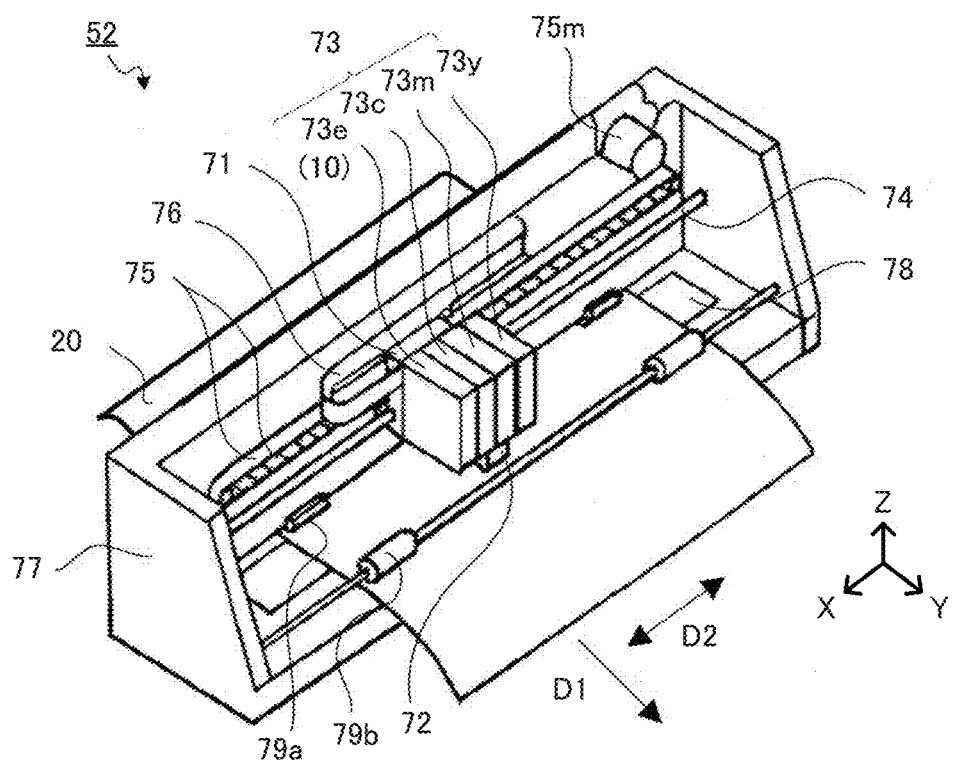
FIG. 5 is a drawing illustrating an overview of a printing unit provided with the ink according to the embodiment.

Hereinafter, a description is given of an ink, a printing apparatus, a printing method, a manufacturing method for a shaped object, and a thermal expansion sheet according to embodiments of this application while referencing the drawings. As described later, in the embodiments, a pseudo-three-dimensional image forming system 50 is used as an example of the printing apparatus. FIGS. 4A to 4C illustrate an overview of this pseudo-three-dimensional image forming system 50. A configuration in which the pseudo-three-dimensional image forming system 50 is used to form a shaped object (pseudo-three-dimensional image) having convexities and/or concavities is used as an example of the printing method. The printing unit illustrated in FIG. 5 is provided in the pseudo-three-dimensional image forming system 50, and an ink 10 of this embodiment is set in the printing unit and used to form a photothermal conversion layer on a thermal expansion sheet 20.

In this embodiment, the shaped object is expressed on the surface of the thermal expansion sheet 20 by the bulging of a thermal expansion layer 22. Additionally, in this application, the term "shaped object" should be interpreted broadly to include simple shapes, geometric shapes, characters, decorations, and the like. The term "decorations" refers to objects that appeal to the aesthetic sense through visual and/or tactile sensation. The term "shaped (or molded)" does not simply refer to the forming of a shaped object, but should be construed to also include concepts such as adding decorations and forming decorations. The phrase "decorative shaped object" refers to a shaped object formed as a result of adding a decoration or forming a decoration.

The shaped object according to the present embodiments uses as a reference a particular two-dimensional face (for example, an XY plane) within a three-dimensional space, and includes unevenness (for example, a Z axis) perpendicular to the face. Such shaped object is one example of three-dimensional (3D) images, but so as to distinguish from a three-dimensional image manufactured using a so-called 3D printing technique, the shaped object is called a 2.5-dimensional (2.5D) image or a pseudo-three-dimensional (pseudo-3D) image. Furthermore, the technique for manufacturing the shaped object is one example of three-dimensional image printing techniques, but so as to distinguish from a so-called 3D printer, the technique is called a 2.5-dimensional (2.5D) printing technique or a pseudo-three-dimensional (pseudo-3D) printing technique.

The ink 10 according to this embodiment includes an inorganic infrared absorbing agent and, in addition thereto, may include any or all of ingredients selected from a solvent (water or organic solvent), a colorant (dye or pigment), a dispersant, a penetrant, an anti-drying agent, a pH adjuster, a preservative, a surfactant, and the like. The ink 10 may include these ingredients at any concentrations.

In an example in which the ink 10 is a water-based ink, the ink 10 includes an inorganic infrared absorbing agent, water, and an aqueous organic solvent. The aqueous organic solvent is not particularly limited, and examples thereof include polyalkylene glycols such as polyethylene glycol and polypropylene glycol; alkylene glycols such as ethylene glycol and triethylene glycol; glycerine; glycerols; lower alkyl ethers of polyhydric alcohols such as triethylene glycol monobutyl ether, ethylene glycol methyl (ethyl) ether, and diethylene glycol methyl (ethyl) ether; N-methyl-2-pyrrolidone; 1,3-dimethyl-2-imidazolidinone; ethanol; and isopropanol. These aqueous organic solvents are included in the ink 10 as the humectant, surfactant, and the like. Additionally, the ink 10 may include triethanolamine as the pH adjuster, and may also include other additives.

In one example, the ink 10 of this embodiment is used in the inkjet printing unit 52 illustrated in FIG. 5. Specifically, the ink 10 is loaded into a cartridge and, as illustrated in FIG. 5, the cartridge is set in the printing unit 52.

The ink 10 may optionally include a coloring agent. When, as in this embodiment, the ink 10 is used to form a photothermal conversion layer for heating a specific region of the thermal expansion sheet 20, it is preferable that the photothermal conversion layer does not affect the color of the color ink. As such, in uses such as those described in this embodiment, it is preferable that the ink 10 is free of coloring agents. However, in cases where the ink 10 does include a coloring agent, the color of the coloring agent is preferably white, yellow, or a similar inconspicuous color. Note that the color of the coloring agent is not particularly limited. For example, in a case where the color of the ink 10 does not particularly affect the appearance of the thermal expansion sheet 20 such as when the ink 10 is formed in an inconspicuous location, a case where the thermal expansion sheet 20 itself is colored, or a case where it is preferable that the printed region be colored so as to facilitate recognition, the color of the coloring agent may be appropriately selected from white, yellow, cyan, magenta, black, or any other color. Moreover, the density of the coloring agent in the ink 10 is not particularly limited.

An inorganic material is used as the inorganic infrared absorbing agent. This inorganic material has higher absorptivity of light (absorptivity) in at least one region of the infrared light spectrum than in the visible light spectrum. In particular, it is preferable that the inorganic infrared absorbing agent has a higher absorptivity of light in the near-infrared region than in the visible light spectrum. The visible light transparency of the ink 10 can be improved and the color of the ink 10 can be suppressed by selecting a material for which light transmittance (low absorptivity) in the visible light spectrum is high. By using a photothermal conversion layer printed using the ink 10, blurring of the color of the color ink layer can be prevented compared to when using traditional carbon-containing inks.

In this embodiment, examples of the inorganic infrared absorbing agent include metal oxides, metal borides, and metal nitrides.

Specific examples of the metal oxides include tungsten oxide compounds, indium oxide, indium tin oxide (ITO), antimony tin oxide (ATO), titanium oxide, zirconium oxide, tantalum oxide, cesium oxide, and zinc oxide.

A metal multiboride compound is preferable and a metal hexaboride compound is particularly preferable as the metal boride, and one or a plurality of materials selected from the group consisting of lanthanum hexaboride (LaB$_6$), cerium hexaboride (CeB6), praseodymium hexaboride (PrB$_6$), neodymium hexaboride (NdB$_6$), gadolinium hexaboride (GdB$_6$), terbium hexaboride (TbB$_6$), dysprosium hexaboride (DyB$_6$), holmium hexaboride (HoB$_6$), yttrium hexaboride (YB$_6$), samarium hexaboride (SmB$_6$), europium hexaboride (EuB$_6$), erbium hexaboride (ErB$_6$), thulium hexaboride (TbB$_6$), ytterbium hexaboride (YbB$_6$), lutetium hexaboride (LuB$_6$), lanthanum hexaboride cerium ((La, Ce)B$_6$), strontium hexaboride (SrB$_6$), calcium hexaboride (CaB$_6$), or the like can be used as the metal boride.

Examples of the metal nitrides include titanium nitride, niobium nitride, tantalum nitride, zirconium nitride, hafnium nitride, and vanadium nitride.

The tungsten oxide compound is expressed by the following formula:

$$M_xW_yO_z \qquad (I)$$

Here, element M is at least one element selected from the group consisting of Cs, Rb, K, Tl, In, Ba, Li, Ca, Sr, Fe, and Sn, W is tungsten, and O is oxygen.

It is preferable that the value of x/y satisfies the relationship $0.001 \le x/y \le 1.1$, and it is particularly preferable that x/y is in the vicinity of 0.33. Additionally, it is preferable that the value of z/y satisfies the relationship $2.2 \le z/y \le 3.0$. Specific examples of the formula of the tungsten oxide compound include $Cs_{0.33}WO_3$, $Rb_{0.33}WO_3$, $K_{0.33}WO_3$, and $Tl_{0.33}WO_3$.

Of the examples of the inorganic infrared absorbing agent described above, the metal hexaboride compound or the tungsten oxide compound is preferable, and the lanthanum hexaboride (LaB$_6$) or cesium tungsten oxide are particularly preferable from the perspectives of obtaining high light absorptivity (low light transmittance) in the near-infrared region and high transmittance in the visible light spectrum. Any one of the inorganic infrared absorbing agents described above may be used alone, or a combination of two or more different materials may be used.

While not particularly limited thereto, the ink 10 of this embodiment includes the inorganic infrared absorbing agent at a concentration of 20 wt. % to 0.10 wt. %.

Figure 1:
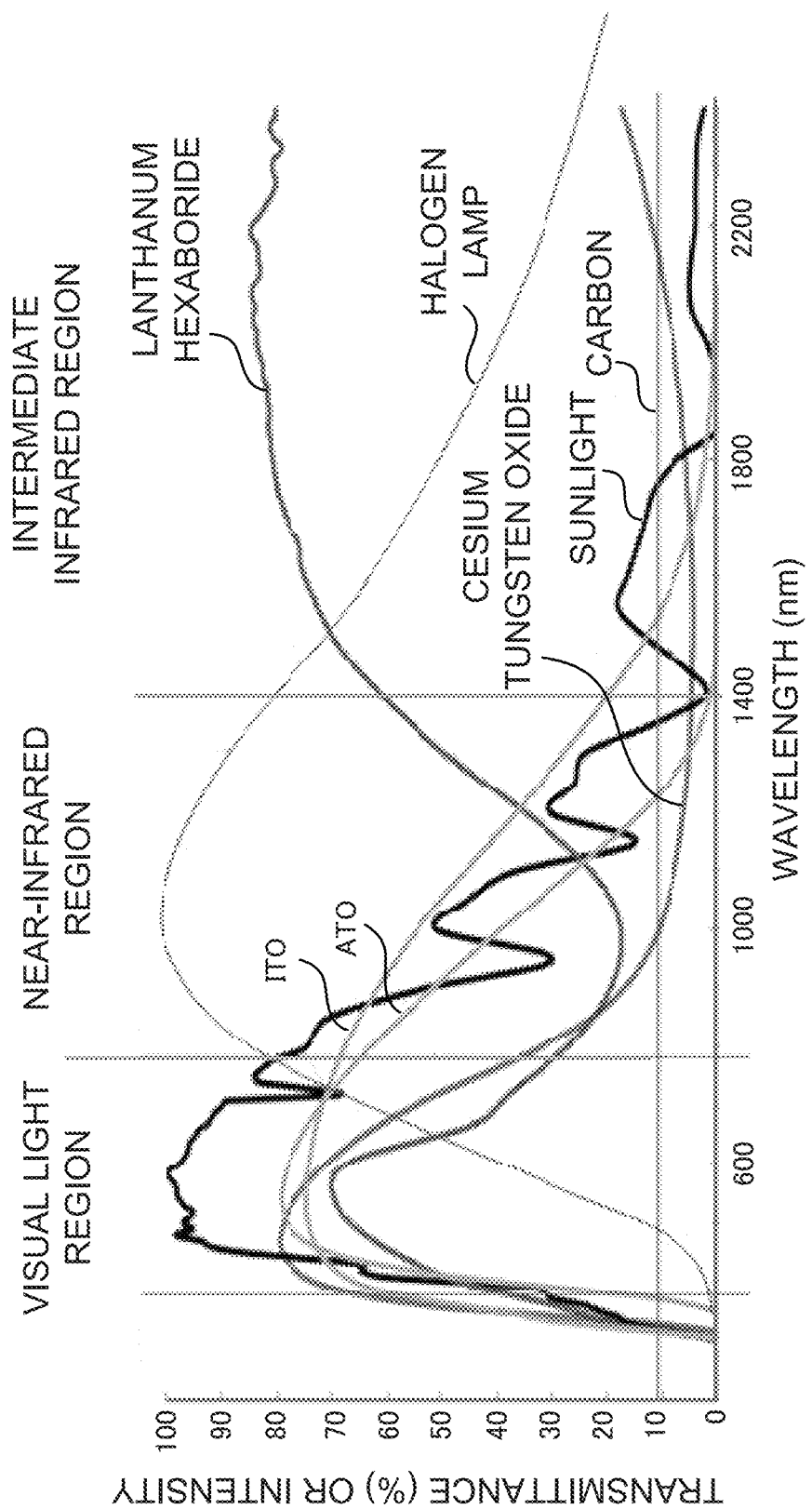
FIG. 1 is a drawing illustrating distributions of the absorptivity of various materials, the sunlight intensity spectrum, and the sunlight specific intensity of a halogen lamp.

FIG. 1 illustrates distributions of the light transmittance of carbon, ITO, ATO, cesium tungsten oxide, and LaB$_6$, the sunlight intensity spectrum, and the spectral distribution of a halogen lamp. In FIG. 1, the sunlight intensity spectrum and the spectral distribution of the halogen lamp each have intensities that peak at 100. As illustrated in FIG. 1, the carbon traditionally used to form photothermal conversion layers displays substantially constant transmittance in various wavelength ranges. Carbon has low transmittance (high absorptivity) and exhibits a black color in the visible light spectrum. In contrast, ITO and ATO, which are examples of the metal oxide, have remarkably high transmittance in the visible light spectrum. In addition, ITO and ATO display lower transmittance in the near-infrared region and even lower transmittance (high absorptivity) in the intermediate infrared region than in the visible light spectrum. Furthermore, the cesium tungsten oxide, which is an example of the tungsten oxide compound, displays lower transmittance in the near-infrared region than in the visible light spectrum. Moreover, the lanthanum hexaboride, which is an example of the metal hexaboride compound, displays lower transmittance in the near-infrared region of the infrared spectrum than in the visible light spectrum.

FIG. 1 also depicts the spectral distribution of the halogen light used as an irradiating unit. Light irradiated from the halogen lamp displays high intensity, particularly in the near-infrared region. The cesium tungsten oxide and the lanthanum hexaboride depicted in FIG. 1 have low transmittance and display high absorptivity in the near-infrared region, where the light irradiated from the halogen lamp displays high intensity. As such, when the halogen lamp is used as the irradiating unit, it is preferable that the cesium tungsten oxide or the LaB$_6$ be used because light will be absorbed with particularly high efficiency in the near-infrared region, where the light irradiated from the halogen lamp displays high intensity. In addition, provided that high absorptivity in the near-infrared region is displayed, a material other than the cesium tungsten oxide and the lanthanum hexaboride may be used.

Figure 2:
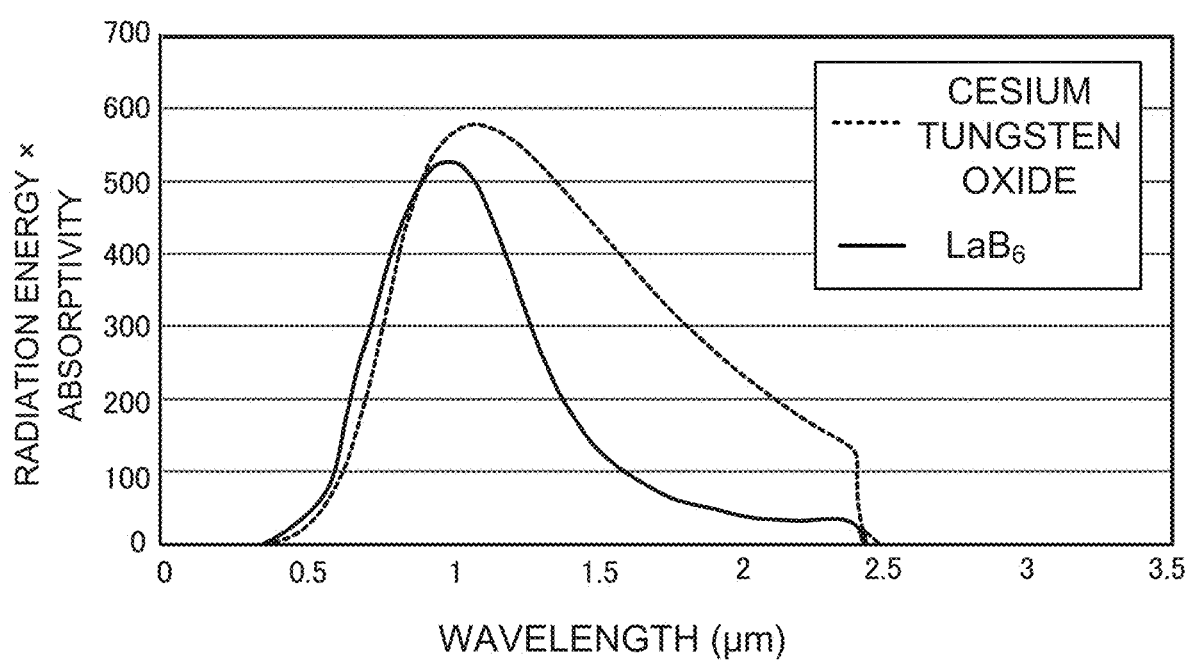
FIG. 2 is a graph depicting the products of multiplying the absorptivity of cesium tungsten oxide or the absorptivity of $LaB_6$ by the radiation energy (%) from the halogen lamp at various wavelengths.

FIG. 2 is a graph depicting the products of multiplying the absorptivity of cesium tungsten oxide or the absorptivity of LaB$_6$ by the radiation energy (%) from the halogen lamp at various wavelengths. Here, the ratio (%) of radiation energy at a temperature (2900K) to black-body radiation (peak set at 100%) at a reference temperature (2000K) is used as the radiation energy (%). From FIG. 1, it is clear that the cesium tungsten oxide is capable of excellent energy absorption, particularly in the near-infrared region and intermediate infrared region.

Values obtained by integrating the graph by wavelength correspond to amounts of energy absorbable by the cesium tungsten oxide and the LaB$_6$. Accordingly, provided that the foaming height of the thermally expandable material is not saturated, the ratio of these integral values is proportional to the foaming height. Specifically, the ratio of integral values of cesium tungsten oxide:LaB$_6$ is 1:0.58. Thus, the foaming height obtainable in a photothermal conversion layer using LaB$_6$ is about 0.58-times greater than the foaming height obtainable in a photothermal conversion layer using cesium tungsten oxide.

Figure 3:
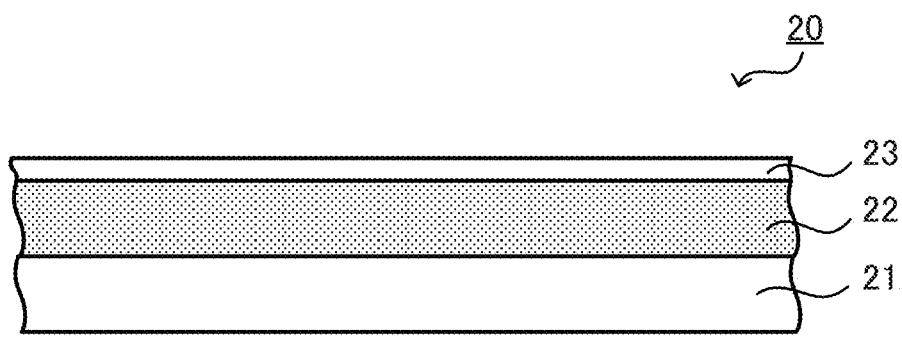
FIG. 3 is a cross-sectional view illustrating an overview of a thermal expansion sheet according to an embodiment.

Next, a description of the thermal expansion sheet 20, on which the photothermal conversion layer is to be formed by the ink 10, of this embodiment will be given while referencing the drawings. As illustrated in FIG. 3, the thermal expansion sheet 20 includes a base material 21, a thermal expansion layer 22, and an ink receiving layer 23. While described in detail later, the thermal expansion sheet 20 is subjected to printing by the pseudo-pseudo-three-dimensional image forming system 50 outlined in FIGS. 4A to 4C. As a result of the printing, a shaped object (pseudo-three-dimensional image) having convexities and/or concavities is formed on the thermal expansion sheet 20.

The base material 21 is implemented as a sheet-like member (including films). The base material 21 supports the thermal expansion layer 22 and the like. Examples of the base material 21 include paper such as high-quality paper, and commonly used plastic film such as polypropylene, polyethylene terephthalate (PET), and polybutylene terephthalate (PBT). Additionally, fabric or the like may be used as the base material 21. The base material 21 has sufficient strength so that, when part or all of the thermal expansion layer 22 swells due to foaming, the opposite side of the base material 21 does not bulge, and wrinkles, waves, and the like do not form. The base material 21 also has heat resistance sufficient to resist heating carried out to foam the thermal expansion layer 22.

The thermal expansion layer 22 is formed on a first face (the upper face illustrated in FIG. 3) of the base material 21.

The thermal expansion layer 22 is a layer that swells to a size in accordance with heating temperature and heating time, and includes a plurality of thermally expandable materials (thermally expandable microcapsules, microcapsules) dispersed/disposed therethroughout. While described in detail later, in this embodiment, a photothermal conversion layer is formed on the ink receiving layer 23 provided on the upper face (surface) of the base material 21 and/or on the lower face (back face) of the base material 21. The regions where the photothermal conversion layer is provided are heated by irradiating the photothermal conversion layer with light. The thermal expansion layer 22 absorbs the heat generated by the photothermal conversion layer provided on the surface and/or back face of the thermal expansion sheet 20, foams, and swells. As such, it is possible to selectively cause only specific regions of the thermal expansion sheet 20 to swell.

A thermoplastic resin selected from vinyl acetate polymers, acrylic polymers, and the like is used as a binder. The thermally expandable microcapsules include propane, butane, or a similar low boiling point volatile substance encapsulated in thermoplastic resin shells. The shells are formed from a thermoplastic resin selected from, for example, polystyrene, polyvinyl chloride, polyvinylidene chloride, polyvinyl acetate, polyacrylic acid ester, polyacrylonitrile, polybutadiene, and copolymers thereof. An average particle size of the thermally expandable microcapsules is about 5 to 50 µm. When these microcapsules are heated to a thermal expansion start temperature or higher, the polymer shells that are made from the resin soften and the low boiling point volatile substance encapsulated therein vaporizes. The pressure resulting from this vaporization causes the capsules to swell. While dependent on the characteristics of the microcapsules to be used, the microcapsules swell to a size about five-times larger than that prior to swelling.

The ink receiving layer 23 is formed on the thermal expansion layer 22. The ink receiving layer 23 receives and holds ink used in a printing process, such as the ink of an inkjet printer. The ink receiving layer 23 is formed using a commonly used material in accordance with the ink to be used in the printing process. In an example in which water-based ink is used, the ink receiving layer 23 is formed using a material selected from porous silica, polyvinyl alcohol (PVA), or the like. Additionally, when the photothermal conversion layer is to be formed on the back face of the base material 21 as well, an ink receiving layer may also be formed on the back face of the base material 21.

Pseudo-Three-Dimensional (Pseudo-3D) Image Forming System

Next, a description will be given of the pseudo-three-dimensional image forming system 50 that performs the printing on the thermal expansion sheet 20 to form a pseudo-three-dimensional image. As illustrated in FIGS. 4A to 4C, the pseudo-three-dimensional image forming system 50 includes a control unit 51, a printing unit 52, an expansion unit 53, a display unit 54, a top panel 55, and a frame 60. FIG. 4A is a front view of the pseudo-three-dimensional image forming system 50; FIG. 4B is a plan view of the pseudo-three-dimensional image forming system 50 with the top panel 55 closed; and FIG. 4C is a plan view of the pseudo-three-dimensional image forming system 50 with the top panel 55 open. In FIGS. 4A to 4C, the X-direction is the same as the horizontal direction, the Y-direction is the same as a transport direction D in which the sheet is transported, and the Z-direction is the same as the vertical direction. The X-direction, the Y-direction, and the Z-direction are orthogonal to each other.

The control unit 51, the printing unit 52, and the expansion unit 53 are each mounted in the frame 60 as illustrated in FIG. 4A. Specifically, the frame 60 includes a pair of substantially rectangular side face panels 61 and a connecting beam 62 provided between the side face panels 61. The top panel 55 spans between upper portions of the side face panels 61. The printing unit 52 and the expansion unit 53 are disposed side-by-side in the X-direction on the connecting beam 62 that spans between the side face panels 61, and the control unit 51 is fixed below the connecting beam 62. The display unit 54 is embedded in the top panel 55 so as to be flush with the upper face of the top panel 55.

The control unit 51 includes a central processing unit (CPU), read only memory (ROM), random access memory (RAM), and the like, and controls the printing unit 52, the expansion unit 53, and the display unit 54.

The printing unit 52 is an inkjet printing apparatus. As illustrated in FIG. 4C, the printing unit 52 includes a loading section 52a for loading the thermal expansion sheet 20, and a discharge section 52b for discharging the thermal expansion sheet 20. The printing unit 52 prints a designated image on the front face or the back face of the thermal expansion sheet 20 loaded through the loading section 52a, and discharges the thermal expansion sheet 20 on which the image has been printed through the discharge section 52b. Additionally, the printing unit 52 includes color ink (cyan (C), magenta (M), and yellow (Y)) for forming a color ink layer 42 (described later), and the ink 10 for forming a front side photothermal conversion layer 41 and a back side photothermal conversion layer 43. Note that the printing unit 52 may also include a black color ink free of carbon black as color ink for forming black or gray color in the color ink layer 42.

The printing unit 52 acquires color image data representing a color image (color ink layer 42) to be printed on the front face of the thermal expansion sheet 20, and prints the color image (color ink layer 42) using the color ink (cyan, magenta, and yellow) on the basis of the color image data. Black or gray color in the color ink layer is formed by blending the three CMY colors or by using a black color ink free of carbon black.

The printing unit 52 prints the front side photothermal conversion layer 41 on the basis of front face foaming data using the ink 10. This front face foaming data is data that indicates the portion of the front face of the thermal expansion sheet 20 to be foamed and caused to swell. Likewise, the printing unit 52 prints the back side photothermal conversion layer 43 on the basis of back face foaming data using the ink 10. This back face foaming data is data that indicates the portion of the back face of the thermal expansion sheet 20 to be foamed and caused to swell. The swelling height of the thermal expansion layer 22 corresponds to the density of the ink 10, and greater densities lead to greater swelling heights. As such, the shade of the ink 10 is determined by area coverage modulation or a similar technique such that the density of the ink 10 corresponds to the target height.

FIG. 5 illustrates a detailed configuration of the printing unit 52. As illustrated in FIG. 5, the printing unit 52 includes a carriage 71 capable of reciprocating movement in a main scanning direction D2 (the X-direction), which is orthogonal to a sub scanning direction D1 (the Y-direction). The sub scanning direction D1 is the direction in which the thermal expansion sheet 20 is transported.

A print head 72 that executes the printing and ink cartridges 73 (73e, 73c, 73m, and 73y) containing ink are attached to the carriage 71. The ink cartridges 73e, 73c, 73m, and 73y respectively contain the ink 10 of this embodiment, and cyan (C), magenta (M), and yellow (Y) color ink. Each ink is discharged from a corresponding nozzle of the print head 72.

The carriage 71 is supported slidably on a guide rail 74, and is sandwiched between drive belts 75. The drive belts 75 are driven by the rotation of a motor 75m and, as a result, the carriage 71 moves in the main scanning direction D2 together with the print head 72 and the ink cartridges 73.

A platen 78 is provided in a lower portion of the frame 77, at a position facing the print head 72. The platen 78 extends in the main scanning direction D2 and constitutes a portion of a transport path of the thermal expansion sheet 20. A pair of feed rollers 79a (lower roller not illustrated in the drawings) and a pair of discharge rollers 79b (lower roller not illustrated in the drawings) are provided in the transport path of the thermal expansion sheet 20. The pair of feed rollers 79a and the pair of discharge rollers 79b transport the thermal expansion sheet 20 in the sub scanning direction D1. Here, the thermal expansion sheet 20 is supported on the platen 78.

The printing unit 52 is connected to the control unit 51 via a flexible communication cable 76. The control unit 51 controls the print head 72, the motor 75m, the pair of feed rollers 79a, and the pair of discharge rollers 79b via the flexible communication cable 76. Specifically, the control unit 51 controls the pair of feed rollers 79a and the pair of discharge rollers 79b to transport the thermal expansion sheet 20. Additionally, the control unit 51 causes the motor 75m to rotate, thereby moving the carriage 71 and transporting the print head 72 to an appropriate position in the main scanning direction D2.

The expansion unit 53 applies heat to the thermal expansion sheet 20 to cause the thermal expansion sheet 20 to swell. As illustrated in FIG. 4C, the expansion unit 53 includes an loading section 53a for loading the thermal expansion sheet 20, and a discharge section 53b for discharging the thermal expansion sheet 20. The expansion unit 53 transports the thermal expansion sheet 20 loaded through the loading section 53a and, at the same time, applies heat to the thermal expansion sheet 20, thereby causing the thermal expansion sheet 20 to swell. An irradiating unit (not illustrated in the drawings) is provided in the expansion unit 53. The irradiating unit is fixed within the expansion unit 53. The thermal expansion sheet 20 is moved at a constant speed past the vicinity of the irradiating unit and, as a result, the entire thermal expansion sheet 20 is heated. Note that, when printing the ink 10 at a low density to make the photothermal conversion layer less conspicuous, the target swelling height can still be obtained by reducing the transport speed and lengthening the amount of time that the thermal expansion sheet 20 is irradiated with the light.

In one example, the irradiating unit is a halogen lamp that irradiates, at the thermal expansion sheet 20, light in the near-infrared region (750 to 1400 nm wavelength range), the visible light spectrum (380 to 750 nm wavelength range), or the intermediate infrared region (1400 to 4000 nm wavelength range). The wavelength of the light irradiated from the halogen lamp has the characteristics illustrated in FIG. 1. Specifically, the halogen lamp irradiates light of particularly high intensity in the near-infrared region. Using a material having higher absorptivity in the near-infrared region than in the visible light spectrum as the inorganic infrared absorbing agent included in the ink 10 of this embodiment is preferable because the wavelength range displaying high intensity of the halogen lamp and the wavelength range displaying efficient absorptivity of the inorganic infrared absorbing agent will match. In addition to the halogen lamp, a xenon lamp or the like may also be used as the irradiating unit. In this case, it is preferable that a material having high absorptivity in the wavelength range where the emission intensity of the lamp is high is used as the inorganic infrared absorbing agent. Additionally, light is converted to heat more efficiently in the regions where the photothermal conversion layer is printed than in regions where the photothermal conversion layer is not printed. As such, the region of the thermal expansion layer 22 where the photothermal conversion layer is printed is primarily heated and, as a result, the region of the thermal expansion layer 22 where the photothermal conversion layer is printed swells.

The display unit 54 is implemented as a touch panel or the like. In the example illustrated in FIG. 4B, the display unit 54 displays an image (the stars illustrated in FIG. 4B) printed on the thermal expansion sheet 20 by the printing unit 52. Additionally, the display unit 54 displays operating instructions or the like, and a user can operate the pseudo-three-dimensional image forming system 50 by touching the display unit 54.

Pseudo-Three-Dimensional (Pseudo-3D) Image Forming Processing

Next, an explanation will be given of the flow of processing whereby a pseudo-three-dimensional image is formed on the thermal expansion sheet 20 by the pseudo-three-dimensional image forming system 50, while referencing the flowchart illustrated in FIG. 6, and the cross-sectional views of the thermal expansion sheet 20 illustrated in FIGS. 7A to 7E. Since the shaped object is manufactured by the pseudo-three-dimensional image forming processing, the pseudo-three-dimensional image forming processing is also a manufacturing method for the shaped object.

Figure 7A:
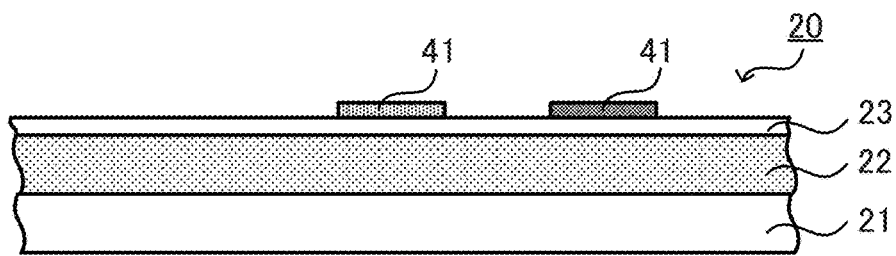
FIGS. 7A to 7E are drawings illustrating the pseudo-three-dimensional image forming process according to the embodiment.

First, a user prepares a thermal expansion sheet 20 on which a pseudo-three-dimensional image has not been formed, and designates the color image data, the front face foaming data, and the back face foaming data using the display unit 54. Then, the user inserts the thermal expansion sheet 20 into the printing unit 52 with the front face facing upward. The printing unit 52 prints a photothermal conversion layer (the front side photothermal conversion layer 41) on the front face of the inserted thermal expansion sheet 20 (step S1). The front side photothermal conversion layer 41 is formed by the ink 10 described above. The printing unit 52 discharges the ink 10 of this embodiment onto the front face of the thermal expansion sheet 20 in accordance with the designated front face foaming data. As a result, the front side photothermal conversion layer 41 is formed on the ink receiving layer 23, as illustrated in FIG. 7A. Note that, to facilitate comprehension, an example is illustrated in which the front side photothermal conversion layer 41 is formed on the ink receiving layer 23 but, more accurately, the ink is received into the ink receiving layer 23 and, as such, the front side photothermal conversion layer 41 is formed in the ink receiving layer 23.

Figure 7B:
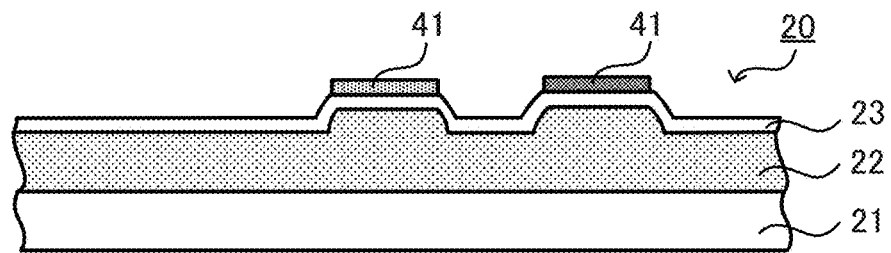

Second, the user inserts the thermal expansion sheet 20 onto which the front side photothermal conversion layer 41 has been printed into the expansion unit 53 with the front face facing upward. The expansion unit 53 heats the inserted thermal expansion sheet 20 from the front face (step S2). Specifically, the irradiating unit of the expansion unit 53 irradiates light onto the front face of the thermal expansion sheet 20. The front side photothermal conversion layer 41 printed on the front face of the thermal expansion sheet 20 absorbs the irradiated light, thereby generating heat. As a result, as illustrated in FIG. 7B, the region of the thermal expansion sheet 20 where the front side photothermal conversion layer 41 was printed bulges and swells. In FIG. 7B, when the density of the ink 10 is higher in the front side photothermal conversion layer 41 on the right side than in the front side photothermal conversion layer 41 on the left side, the region printed at the higher density can be made to bulge higher, as illustrated in FIG. 7B.

Figure 7C:
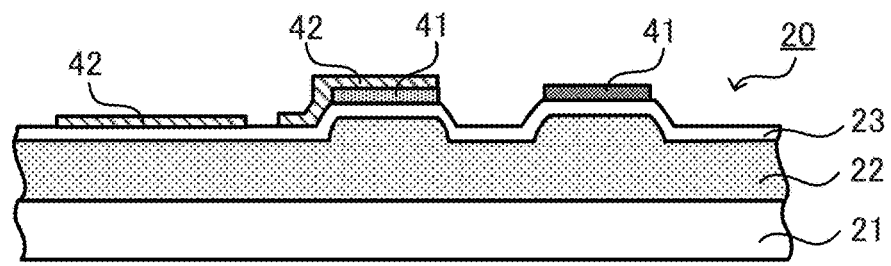

Third, the user inserts the thermal expansion sheet 20, for which the front face has been heated and caused to swell, into the printing unit 52 with the front face facing upward. The printing unit 52 prints a color image (the color ink layer 42) on the front face of the inserted thermal expansion sheet 20 (step S3). Specifically, the printing unit 52 discharges the various cyan (C), magenta (M), and yellow (Y) inks onto the front face of the thermal expansion sheet 20 in accordance with the designated color image data. As a result, the color ink layer 42 is formed on the ink receiving layer 23 and the front side photothermal conversion layer 41, as illustrated in FIG. 7C.

Fourth, the user inserts the thermal expansion sheet 20, onto which the color ink layer 42 has been printed, into the expansion unit 53 with the back face facing upward. The expansion unit 53 heats the inserted thermal expansion sheet 20 from the back face, and dries the color ink layer 42 formed on the front face of the thermal expansion sheet 20 (step S4). Specifically, the irradiating unit of the expansion unit 53 irradiates light onto the back face of the thermal expansion sheet 20, thereby heating the color ink layer 42 and volatilizing the solvent included in the color ink layer 42.

Figure 7D:
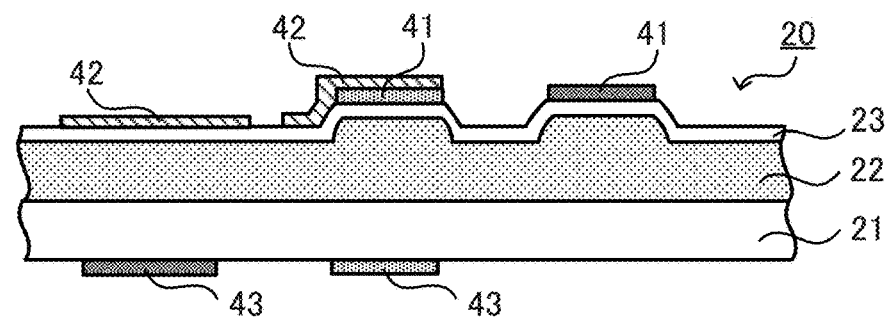

Fifth, the user inserts the thermal expansion sheet 20, onto which the color ink layer 42 has been printed, into the printing unit 52 with the back face facing upward. The printing unit 52 prints a photothermal conversion layer (the back side photothermal conversion layer 43) on the back face of the inserted thermal expansion sheet 20 (step S5). The back side photothermal conversion layer 43 is formed by the ink 10 of this embodiment in the same manner as the front side photothermal conversion layer 41 printed on the front face of the thermal expansion sheet 20. The printing unit 52 discharges the ink 10 onto the back face of the thermal expansion sheet 20 in accordance with the designated back face foaming data. As a result, the back side photothermal conversion layer 43 is formed on the back face of the base material 21, as illustrated in FIG. 7D. For the back side photothermal conversion layer 43 as well, as illustrated in FIG. 7D, when the density of the ink 10 is higher in the back side photothermal conversion layer 43 on the left side than in the back side photothermal conversion layer 43 on the right side, the region printed at the higher density can be made to bulge higher.

Figure 7E:
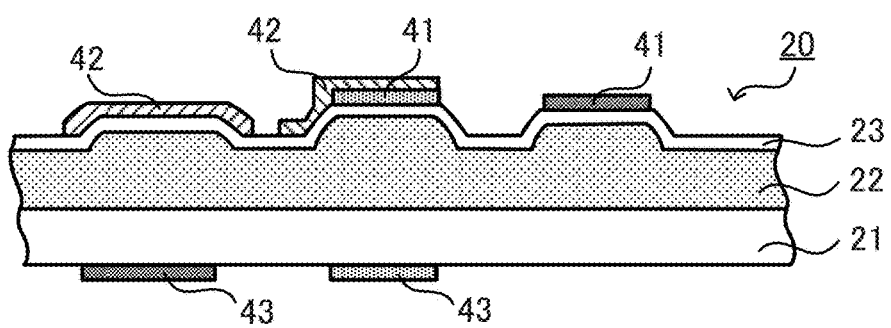

Sixth, the user inserts the thermal expansion sheet 20, onto which the back side photothermal conversion layer 43 has been printed, into the expansion unit 53 with the back face facing upward. The expansion unit 53 heats the inserted thermal expansion sheet 20 from the back face (step S6). Specifically, the irradiating unit (not illustrated in the drawings) of the expansion unit 53 irradiates light onto the back face of the thermal expansion sheet 20. The back side photothermal conversion layer 43 printed on the back face of the thermal expansion sheet 20 absorbs the irradiated light, thereby generating heat. As a result, as illustrated in FIG. 7E, the region of the thermal expansion sheet 20 where the back side photothermal conversion layer 43 was printed bulges and swells.

The pseudo-three-dimensional image is formed in the thermal expansion sheet 20 as a result of carrying out the procedures described above.

The ink 10 of this embodiment includes the inorganic infrared absorbing agent demonstrating higher absorptivity in at least one wavelength region of the infrared spectrum than in the visible light spectrum and, as a result, enables the printing of a photothermal conversion layer that has a reduced effect on the color of the pseudo-three-dimensional image. By using the ink 10 of this embodiment, an ink, a printing apparatus, and a printing method can be provided that enable the printing of a photothermal conversion layer that has a reduced effect on the color of the pseudo-three-dimensional image.

With the ink 10 of this embodiment, it is possible to form photothermal conversion layers with lower black density than when using a carbon black-containing ink conventionally used to form photothermal conversion layers. Moreover, the ink 10 of this embodiment can cause the thermal expansion layer to swell even at densities where conventional inks have difficulty foaming the thermal expansion layer, such as at black densities of 0.1 or lower. Note that a reflection spectral densitometer is used to measure the black density of the photothermal conversion layer after the thermal expansion layer has been caused to swell.

Modified Example of Pseudo-Three-Dimensional (Pseudo-3D) Image Forming Processing The pseudo-three-dimensional image forming processing is not limited to the process order illustrated in FIG. 6, and the order of the steps may be rearranged as detailed hereinafter.

Figure 6:
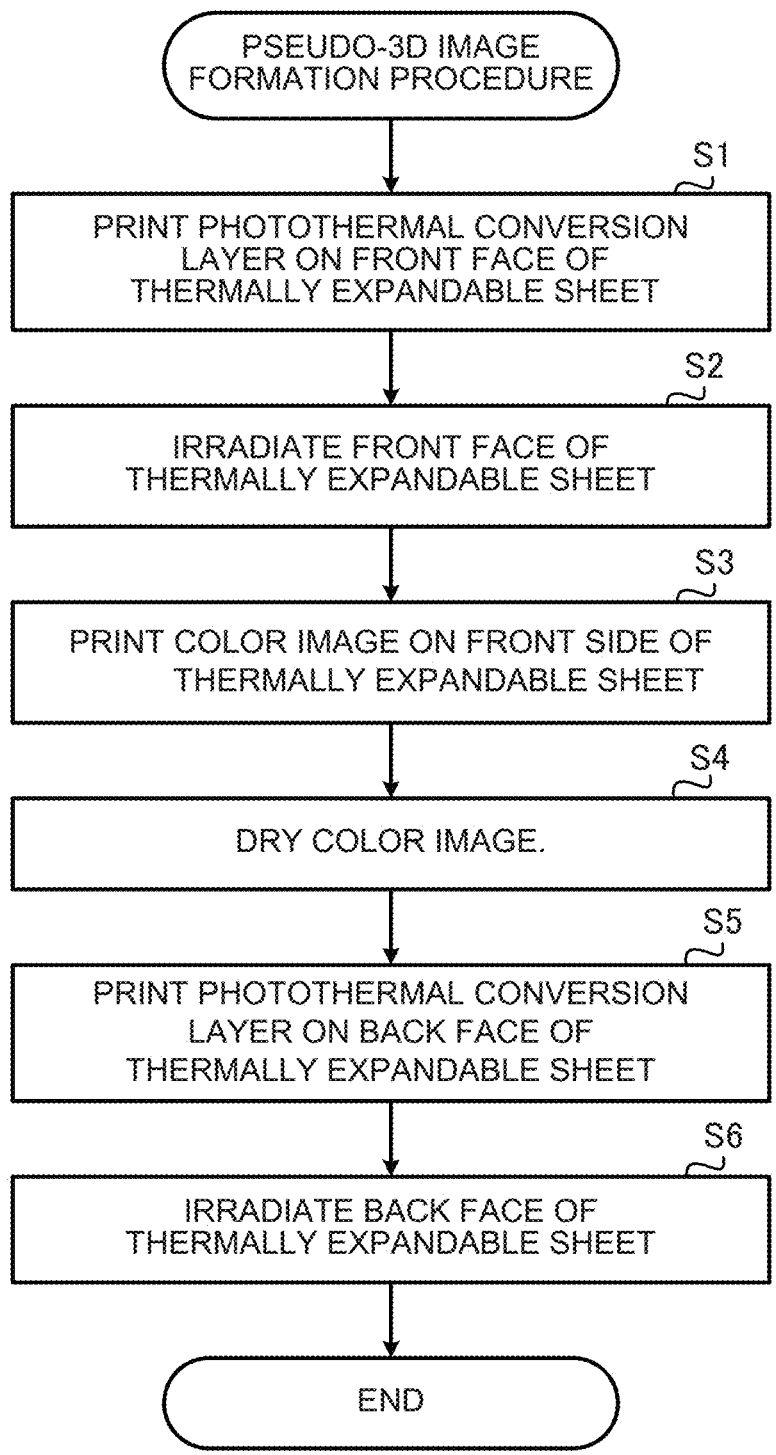
FIG. 6 is a flowchart illustrating a pseudo-three-dimensional image forming process according to the embodiment.

For ease of description, the steps illustrated in FIG. 6 are referred to as follows: the step of forming the front side photothermal conversion layer 41 (hereinafter referred to as "front side conversion layer") on the front side (the upper face in FIG. 3) of the thermal expansion sheet (step S1 in FIG. 6) is referred to as a front side conversion layer forming step; the step of irradiating electromagnetic waves (light) onto the front side of the thermal expansion sheet 20 and causing the thermal expansion layer 22 to swell (step S2 in FIG. 6) is referred to as a front side swelling step; the step of printing the color image on the front side of the thermal expansion sheet 20 (step S3 in FIG. 6) is referred to as a color printing step; the step of forming the back side photothermal conversion layer 43 (hereinafter referred to as "back side conversion layer") on the back side (the lower face in FIG. 3) of the thermal expansion sheet (step S5 in FIG. 6) is referred to as a back side conversion layer forming step; and the step of irradiating electromagnetic waves onto the back side of the thermal expansion sheet 20 and causing the thermal expansion layer 22 to swell (step S6 in FIG. 6) is referred to as a back side swelling step.

While the color ink is dried with the back face of the sheet facing upward in the step of drying the color ink (step S4) illustrated in FIG. 6, but the orientation of the sheet is not limited thereto. In both the embodiments given below, the drying step may be carried out with the front face of the sheet facing upward. In the drying step, whether the front face or the back face is faced upwards is determined on the basis of factors such as which face the conversion layer is formed on and whether the thermal expansion layer 22 is not to be further deformed in the drying step. Additionally, in both of the examples given below, it is possible to omit the drying step (step S4), depending on the order in which the steps are executed.

In one embodiment, the pseudo-three-dimensional image forming processing is not limited to the process order illustrated in FIG. 6, and the back side conversion layer 43 may be formed first. Specifically, the back side conversion layer forming step is performed first, then the back side swelling step is performed, and thereafter, the front side conversion layer forming step is performed. In this case, in terms of the flowchart illustrated in FIG. 6, step S5 and step S6 are executed, and then steps S1 to S4 are executed. Additionally, since the back side conversion layer is already formed at the stage when step S4 is executed, it is preferable that the drying step be carried out with the front face of the sheet facing upward in step S4. Moreover, after all of the steps for causing the thermal expansion layer 22 to swell have been completed, a color image may be printed. In this case, the front side conversion layer forming step, the front side swelling step, the back side conversion layer forming step, and the back side swelling step are sequentially performed and, then, the color printing step is performed. That is, in terms of FIG. 6, step S1 and step S2 are executed, then step S5 and step S6 are executed, and then step S3 and step S4 are executed. Note that step S4 may be omitted. It is also possible to perform the back side conversion layer forming step and the back side swelling step first and, in this case, step S4 and step S6 are executed and then steps S1 to S4 are executed. In this case as well, step S4 may be omitted.

It is also possible to perform the color printing step prior to the front side conversion layer forming step and other steps. This is because the color of the ink of this embodiment is particularly suppressed and, as such, the influence of the photothermal conversion layer on the color of the color layer can be suppressed even when the photothermal conversion layer is formed on the color image. In such cases, the color printing step, the drying step, the front side conversion layer forming step, and the front side swelling step are sequentially performed, and the back side conversion layer forming step and the back side swelling step are performed. In terms of the flowchart illustrated in FIG. 6, step S3 and step S4, then step S1 and step S2, and then step S5 and step S6 are sequentially executed. Note that, in step S4, the drying step may be carried out with the front face of the sheet facing upward. Alternatively, the back side conversion layer forming step may be performed first and, in this case, steps S3 to S6 are sequentially executed and, thereafter, step S1 and step S2 are executed. Note that the drying step may be carried out with the front face of the sheet facing upward.

The color printing step and the front side conversion layer forming step may be combined to print the color ink layer and the front side conversion layer in a single step. In this embodiment, the color ink layer and the front side conversion layer are printed simultaneously.

Next, an explanation will be given of the flow of processing whereby a pseudo-three-dimensional image is formed on the thermal expansion sheet 20 by the pseudo-three-dimensional image forming system 50, while referencing the flowchart illustrated in FIG. 8, and the cross-sectional views of the thermal expansion sheet 20 illustrated in FIGS. 9A to 9D. In this modified example, as illustrated in FIG. 4C, the color ink for printing the color image and the ink 10 for forming the photothermal conversion layer are set in the printing unit 52. The printing unit 52 prints the front side conversion layer 41 on the basis of the front face foaming data using the ink 10. This front face foaming data is data that indicates the portion of the front face of the thermal expansion sheet 20 to be foamed and caused to swell. Likewise, the printing unit 52 prints the back side conversion layer 43 on the basis of the back face foaming data using the ink 10. This back face foaming data is data that indicates the portion of the back face of the thermal expansion sheet 20 to be foamed and caused to swell.

Figure 9A:
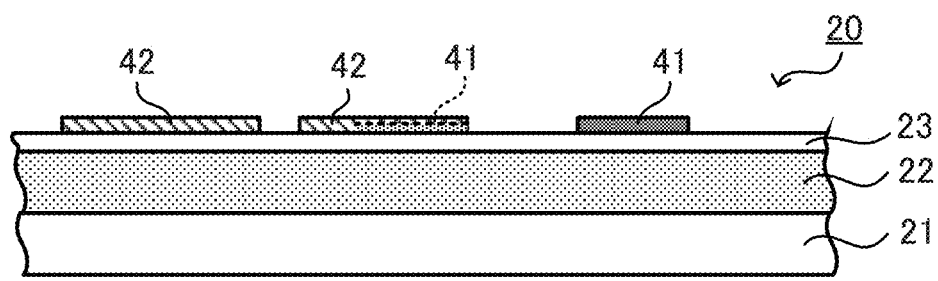
FIGS. 9A to 9D are drawings illustrating the pseudo-three-dimensional image forming process according to the modified example.

First, a user prepares a thermal expansion sheet 20 on which a pseudo-three-dimensional image has not been formed, and designates the color image data, the front face foaming data, and the back face foaming data using the display unit 54. Then, the user inserts the thermal expansion sheet 20 into the printing unit 52 with the front face facing upward. Next, the printing unit 52 prints the front side conversion layer (the front side photothermal conversion layer) 41 and the color image (the color ink layer 42) on the front face of the inserted thermal expansion sheet 20 (step S21). Specifically, the printing unit 52 discharges, on the front face of the thermal expansion sheet 20, the ink 10 of this embodiment in accordance with the designated front face foaming data and the various cyan (C), magenta (M), and yellow (Y) inks in accordance with the designated color image data. As a result, the front side conversion layer 41 and the color ink layer 42 are formed on the ink receiving layer 23, as illustrated in FIG. 9A. Note that, to facilitate comprehension, an example is illustrated in which the front side conversion layer 41 and the color ink layer 42 are formed on the ink receiving layer 23 but, more accurately, the ink 10 and the color ink are received into the ink receiving layer 23 and, as such, the front side conversion layer 41 and the color ink layer 42 are formed in the ink receiving layer 23. In this case, since the front side conversion layer 41 and the color ink layer 42 are formed simultaneously, the front side conversion layer 41 is depicted using dashed lines in FIG. 9A and the like. Note that a drying step such as step S4 in FIG. 6 may be executed after forming the color ink layer 42 (after step S21).

Figure 9B:
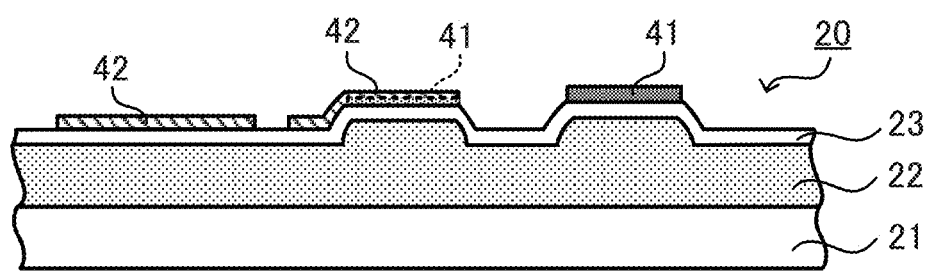

Second, the user inserts the thermal expansion sheet 20, onto which the front side conversion layer 41 and the color ink layer 42 have been printed, into the expansion unit 53 with the front face facing upward. The expansion unit 53 heats the inserted thermal expansion sheet 20 from the front face (step S22). Specifically, the irradiating unit of the expansion unit 53 irradiates light onto the front face of the thermal expansion sheet 20. The front side conversion layer 41 printed on the front face of the thermal expansion sheet 20 absorbs the irradiated light, thereby generating heat. As a result, as illustrated in FIG. 9B, the region of the thermal expansion sheet 20 where the front side conversion layer 41 was printed bulges and swells.

Figure 9C:
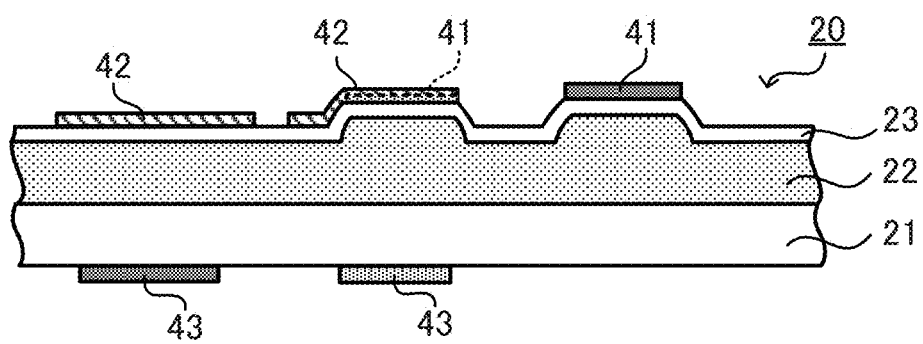

Third, the user inserts the thermal expansion sheet 20 into the printing unit 52 with the back face facing upward. The printing unit 52 prints the back side conversion layer (the back side photothermal conversion layer) 43 on the back face of the inserted thermal expansion sheet 20 (step S23). The printing unit 52 discharges the ink 10 onto the back face of the thermal expansion sheet 20 in accordance with the designated back face foaming data. As a result, the back side photothermal conversion layer 43 is formed on the back face of the base material 21, as illustrated in FIG. 9C.

Figure 9D:
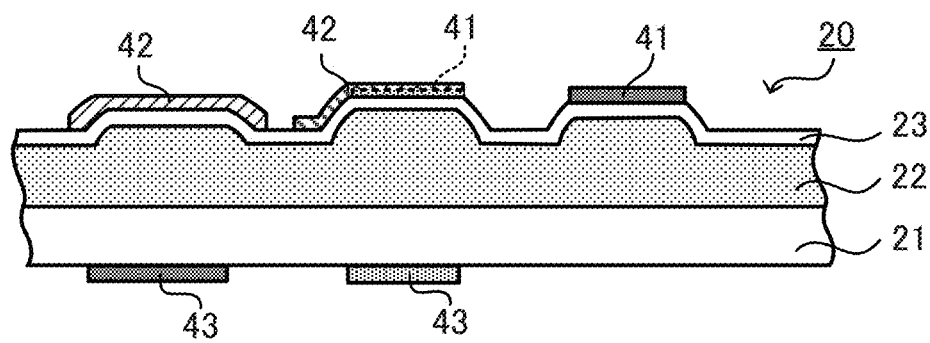

Fourth, the user inserts the thermal expansion sheet 20, onto which the back side conversion layer 43 has been printed, into the expansion unit 53 with the back face facing upward. The expansion unit 53 heats the inserted thermal expansion sheet 20 from the back face (step S24). Specifically, the irradiating unit (not illustrated in the drawings) of the expansion unit 53 irradiates light onto the back face of the thermal expansion sheet 20. As a result, as illustrated in FIG. 9D, the region of the thermal expansion sheet 20 where the back side conversion layer 43 was printed bulges and swells.

The pseudo-three-dimensional image is formed in the thermal expansion sheet 20 as a result of carrying out the procedures described above. Since the color of the ink 10 of this embodiment is particularly suppressed, the influence of the ink 10 of the front side conversion layer 41 on the color of the color ink layer 42 can be suppressed. Accordingly, it is possible to form the front side conversion layer 41 and the color ink layer 42 in a single step, thereby simultaneously forming the front side conversion layer 41 and the color ink layer 42, as depicted in step S21 of this modified example.

Figure 8:
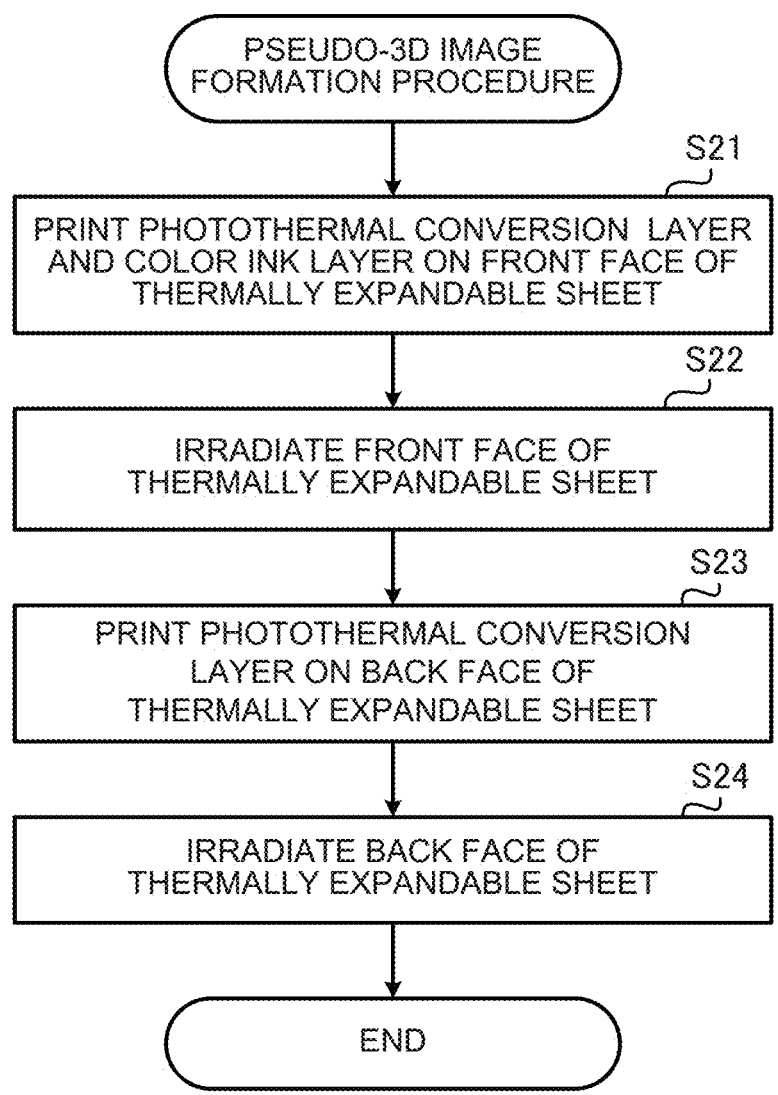
FIG. 8 is a flowchart illustrating a pseudo-three-dimensional image forming process according to a modified example.

This embodiment is not limited to the process order illustrated in FIG. 8, and the back side conversion layer 43 may be formed first. Specifically, in terms of the flowchart illustrated in FIG. 8, step S23 and step S24 are executed, and then steps S21 and S22 are executed.

Additionally, instead of executing the front side swelling step immediately after the front side conversion layer forming step, it is possible to interpose another step such as the color printing step between the front side conversion layer forming step and the front side swelling step. In this case, an order is possible in which steps S1, S3 and S4 of FIG. 6 are executed and then, after all of the steps of printing on the front side of the thermal expansion sheet are completed, the front side swelling step is executed. In this case, step S1 of the flowchart illustrated in FIG. 6 is executed and the front side conversion layer is formed and, then, step S3 and step S4 are executed and the color image is printed. Thereafter, step S2 is executed and the thermal expansion layer is caused to swell. Subsequently, step S5 and step S6 of FIG. 6 are executed and the back side conversion layer is formed and the thermal expansion layer is caused to swell. In this example, it is also possible to execute the back side conversion layer forming step first. In this case, step S5 and step S6 are executed and, then, steps S1, S3, S4, and S2 are sequentially executed. Here, in step S4, the drying step may be carried out with the front face of the sheet facing upward. It is also possible to perform the color printing step between the back side conversion layer forming step and the back side swelling step. In this case, steps S5, S3, S4, and S6 are sequentially executed, then steps S1 and S2 are executed or, alternatively, steps S1 and S2 are executed, then steps S5, S3, S4, and S6 are sequentially executed. Here, in step S4, the drying step may be carried out with the front face of the sheet facing upward.

It is also possible to perform the front side conversion layer forming step, the color printing step, and the back side conversion layer forming step first, and then perform the front side swelling step and the back side swelling step. In this case, in terms of the flowchart illustrated in FIG. 6, step S1, step S3, and step S5 are executed first, and then step S2 and step S6 are executed. Note that the order in which step S1, step S3, and step S5 are executed is not limited to this order and these steps may be arranged in any order. For example, an order of step S5, step S3, and step S1 may be used. Moreover, step S2 and step S6 may be executed in this order, or may be executed in the reverse order. Furthermore, the drying step (step S4) may be executed as necessary, or may be omitted.

It is also possible to perform the front side conversion layer forming step and the back side conversion layer forming step first, then perform the front side swelling step and the back side swelling step, and then perform the color printing step. In this case, for, example, in terms of the flowchart illustrated in FIG. 6, step S1 then step S5, or step S5 then step 1 are executed. Next, step 2 then step 6, or step 6 then step 2 are executed and the thermal expansion layer is caused to swell. Thereafter, step S3 and step S4 are executed and the color image is printed. In this case as well, step S4 may be omitted. It is also possible to perform the color printing step between the front side swelling step and the back side swelling step. In this case, step S1 and step S5 are executed, then one of step S2 and step S6 is executed, then step S3 and step S4 are executed, and then the other of step S2 and step S6 is executed. In this case as well, step S4 may be omitted.

Comparative Example

Figure 10A:
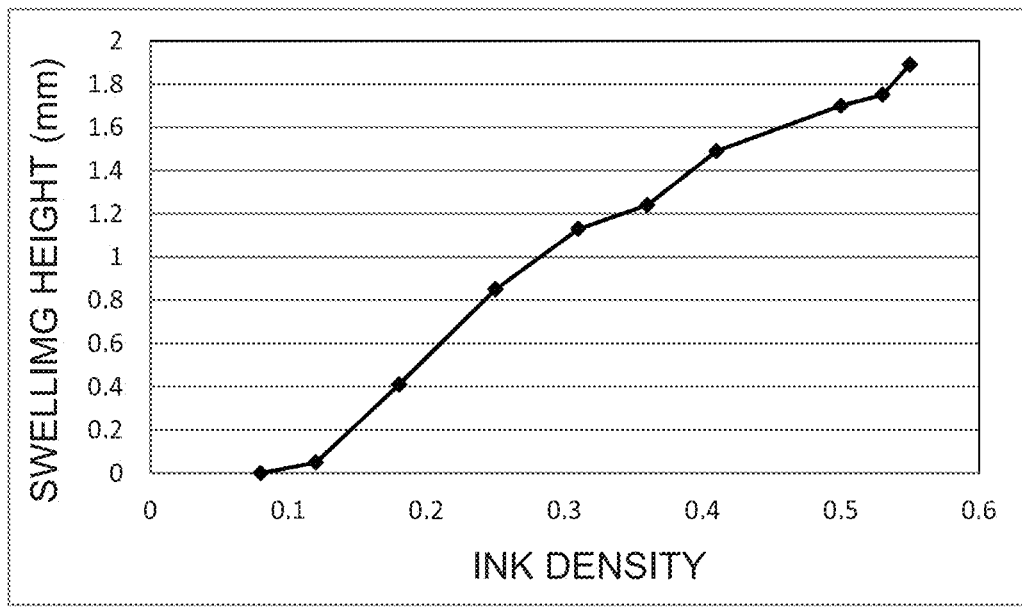
FIG. 10A is a drawing illustrating a black density and a foaming height after printing a conventional black ink.

A comparative example is illustrated in FIG. 10A in which a carbon-containing black ink (pigment ink), traditionally used to form photothermal conversion layers, was used to form a photothermal conversion layer, and the photothermal conversion layer is caused to foam and swell. FIG. 10A is a graph illustrating the relationship between ink density (black density) of the photothermal conversion layer after printing and the swelling height (foaming height) of the thermal expansion layer after swelling. Specifically, a commercially available carbon-containing black pigment ink typically used in inkjet printers was used as the black ink. A plurality of photothermal conversion layers were formed by printing the same image, using an inkjet printer and the black ink, at a plurality of different densities on the front face of a thermal expansion sheet having the same configuration as described above in the embodiment. In this case, the photothermal conversion layers were only formed on the front face of the thermal expansion sheet. Using a halogen lamp, each of the photothermal conversion layers was irradiated with light under the same conditions, and the swelling height (mm) of the thermal expansion sheet at each density was measured. The black density was measured using an eXact reflection spectral densitometer (manufactured by Sakata INX ENG. Co., Ltd.).

Example 1

Figure 10B:
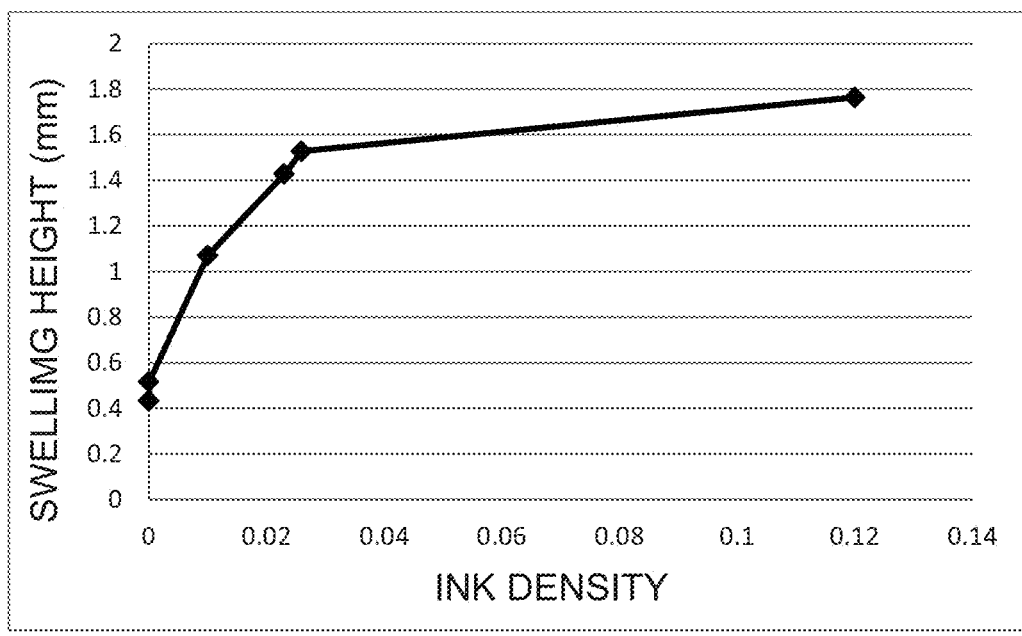
FIG. 10B is a drawing illustrating a black density of the ink of Example 1 before printing, and a black density and a foaming height of the ink of Example 1 after printing.

In Example 1, as illustrated in FIG. 10B, an ink corresponding to the ink 10 of this embodiment was used to form a photothermal conversion layer, and the photothermal conversion layer was caused to foam and swell. FIG. 10B is a graph illustrating the relationship between ink density (black density) of the photothermal conversion layer after printing and the swelling height (foaming height) of the thermal expansion layer after swelling. The ink corresponding to the ink 10 of this embodiment that was used included ingredients similar to those of typical ink. Specifically, the ink 10 was obtained by mixing 5.3 wt. % of cesium tungsten oxide as the inorganic infrared absorbing agent in an ink free of coloring agents. As in the Comparative Example, a plurality of photothermal conversion layers were formed by printing the same image at different densities. In this case, the photothermal conversion layers were only formed on the front face of the thermal expansion sheet. Additionally, as in the Comparative Example, each of the photothermal conversion layers was irradiated with light under the same conditions, and the swelling height (mm) of the thermal expansion sheet at each density was measured. The black density was measured using the same reflection spectral densitometer used in the Comparative Example.

As illustrated in FIG. 10B, it was possible to cause the thermal expansion layer 12 to swell when using the ink of the Example. Moreover, as with the Comparative Example illustrated in FIG. 10A in which the conventional black ink was used, the swelling height increased in accordance with the density. In the Comparative Example illustrated in FIG. 10A, hardly any swelling height was obtained when the black density of the photothermal conversion layer was less than 0.1. In contrast, with the photothermal conversion layer in which the ink of the Example was used, swelling height of about 1.5 mm was obtained even when the black density was less than 0.1. Moreover, in the Comparative Example, the black density at which a swelling height of about 1.5 mm can be obtained was about 0.4. Accordingly, by using the ink of the Example, identical swelling height can be obtained while suppressing the color of the photothermal conversion layer.

It is only possible to visually confirm the color of photothermal conversion at black densities of about 0.02 or greater. Therefore, it was not possible to visually recognize the color of the photothermal conversion layer (the ink) when the black density was set to 0.01. Accordingly, with the ink of the Example, swelling height, equivalent to that achieved by conventional black inks with a black density of 0.4 to 0.5, was obtained near the density at the limit of visual recognition. Furthermore, it was possible to cause the thermal expansion layer to foam and swell even at black densities that are visually unrecognizable. Note that, while the swelling height decreased slightly at black densities of less than 0.01, the photothermal conversion layer can be made to foam higher than the values illustrated in FIG. 10B by lengthening the amount of time that the photothermal conversion layers are irradiated with the light. Additionally, even in regions where the density exceeded 0.02, it was possible to form a photothermal conversion layer with color suppressed more than in conventional black inks.

Example 2

Next, in Example 2, lanthanum hexaboride ($LaB_6$) was used as the inorganic infrared absorbing agent. The $LaB_6$ was mixed in a solvent (FineSolve TH, manufactured by Sankyo Chemical Co., Ltd.) at a content of 0.18 wt. % to form an ink. Using a brush, this ink was applied to the thermal expansion sheet. The photothermal conversion layers were formed by performing two to five applications. In cases where performing two or more applications, the ink was applied at the same location, over the ink applied immediately prior thereto. The same thermal expansion sheet used in Example 1 and the Comparative Example was used. In this case, the photothermal conversion layers were only formed on the front face of the thermal expansion sheet. Additionally, as in Example 1 and the Comparative Example, each of the photothermal conversion layers was irradiated with light under the same conditions. The black density was measured after the thermal expansion layer had been foamed, using the same reflection spectral densitometer used in the Comparative Example.

Figure 11:
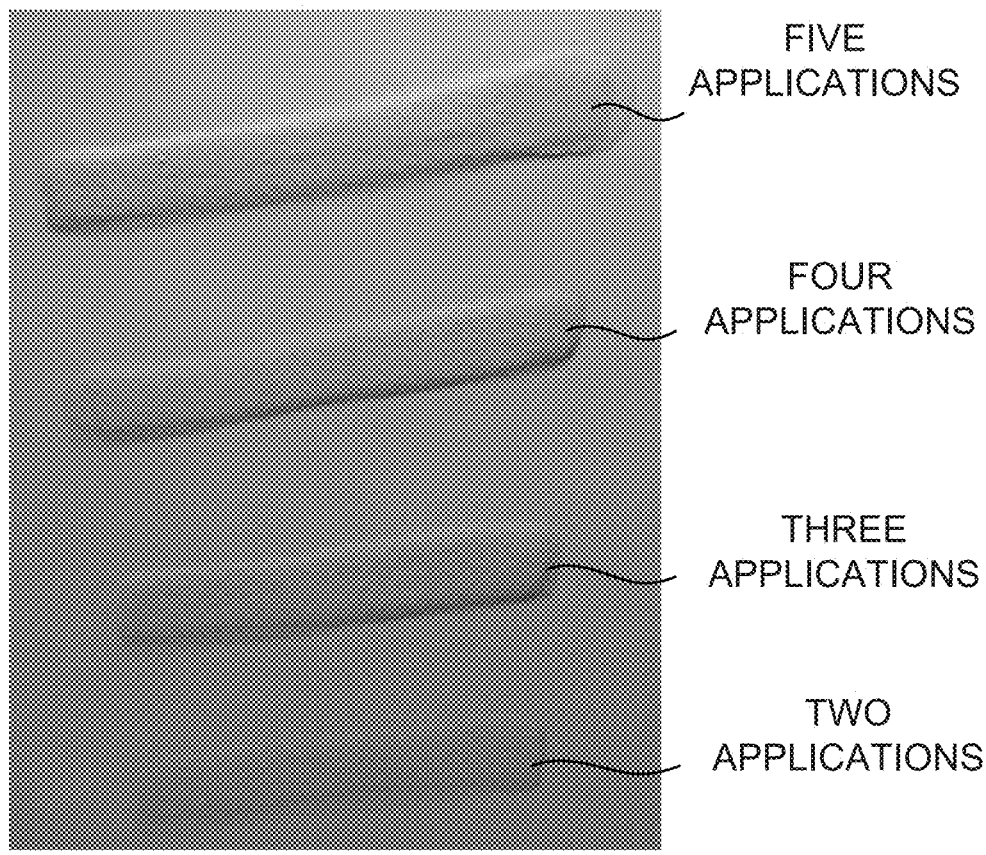
FIG. 11 is an image of a photothermal conversion layer formed using the ink according to Example 2.

The black densities of the photothermal conversion layers after the thermal expansion layer had been foamed are shown in Table 1. FIG. 11 is an image of the photothermal conversion layers that were formed by performing two to five applications. As shown in Table 1, the black density of the photothermal conversion layers increased with each additional application. Specifically, the black density of the photothermal conversion layer was 0.05 at two applications, 0.07 at three applications, 0.08 at four applications, and 0.09 at five applications.

TABLE 1

| Number of Applications | 5 | 4 | 3 | 2 |
|---|---|---|---|---|
| Black Density | 0.09 | 0.08 | 0.07 | 0.05 |

As illustrated in FIG. 11, the thermal expansion layer could be caused to swell in all of the two to five applications. Moreover, as with the Conventional Example, as the number of applications increased, the density increased and, in accordance therewith, the swelling height increased. Accordingly, with the ink according to Example 2, it was possible to form a photothermal conversion layer with color suppressed more than in conventional black inks. In the Comparative Example illustrated in FIG. 10A, almost no swelling height was obtained with photothermal conversion layers where the black density was lower than 0.1. In contrast, as illustrated in FIG. 11, with the photothermal conversion layers formed using the ink of this example, it was possible to cause the thermal expansion layer to swell not only at a black density of 0.09 (five applications), which is lower than the aforementioned black density of 0.1, but also at a black density of 0.05 (two applications). It should be noted that the black density at one application was 0.02, and almost no foaming was observed.

Thus, with the ink 10 of this embodiment, a photothermal conversion layer for which color is suppressed can be formed.

This application is not limited to the embodiment descried above and various modifications and uses are possible.

For example, in the embodiment described above, an example is described in which the printing apparatus is the pseudo-three-dimensional image forming system 50 including the control unit 51, the expansion unit 53, and the like. However, the printing apparatus may consist only of an inkjet printing unit 52 such as that illustrated in FIG. 4.

The ink 10 is not limited to water-based inks used in inkjet printers, and may be an oil-based ink or an ultraviolet curable ink. When the ink 10 is an oil-based ink, the ink 10 includes a solvent, resin, a dispersant, and the like. Examples of the solvent include ketones such as acetone and methyl ethyl ketone, alcohols such as methyl alcohol and ethyl alcohol, esters such as ethyl acetate, and the like. Examples of the resin include acrylic resins, rosin resins, epoxy resins, phenol resins, and the like. When the ink 10 is an ultraviolet curable ink, the ink 10 includes an ultraviolet curable resin such as epoxy acrylate, urethane acrylate, and polyester acrylate, a polymerization initiator, and other additives. Commonly known materials may be used for each of these materials. In addition, depending on the materials to be used it is possible to omit the ink receiving layer 23.

In the embodiment described above, an example was given of a case in which the cartridge mounted in the inkjet printer was filled, but this application is not limited thereto. The ink 10 of this embodiment can be used in other printing methods such as screen printing, gravure printing, offset printing, and flexographic printing. In some cases, it is possible to omit the ink receiving layer 23.

The ink 10 may be a water-based ink, an oil-based ink, or an ultraviolet curable ink. In these cases, the ink 10 includes materials that correspond to the printing method to be used. Examples of these materials include solvents, resins for film formation, and auxiliary agents. Commonly known materials are used for these materials. For example, when the ink 10 is an oil-based ink, the ink 10 includes a solvent, a resin, and other additives in addition to the inorganic infrared absorbing agent. While not limited hereto, examples of the solvent include ketones such as acetone and methyl ethyl ketone, alcohols such as methyl alcohol and ethyl alcohol, esters such as ethyl acetate, and the like; and examples of the resin include acrylic resins, rosin resins, epoxy resins, phenol resins, and the like. While not limited hereto, when the ink 10 is an ultraviolet curable ink, the ink 10 includes an ultraviolet curable resin such as epoxy acrylate, urethane acrylate, and polyester acrylate, a polymerization initiator, and other additives in addition to the inorganic infrared absorbing agent. When the ink 10 is a water-based ink, the ink 10 includes water, a solvent such as an alcohol, a resin such as an acrylic resin, and other additives in addition to the inorganic infrared absorbing agent. Commonly known materials may be used for each of these materials.

Additionally, in an example in which an offset printing apparatus is used, when combining the color printing step and the front side conversion layer forming step so as to print the color ink layer and the front side conversion layer in a single step, the offset printing apparatus is provided with inks such as CMYK inks for printing the color image and the ink 10 of this embodiment, and these inks are used to sequentially print the color ink layer and the front side conversion layer, as illustrated in FIGS. 8 and 9. In this case, the order in which the printing using the ink 10 is performed may be changed as desired. In other words, the printing using the ink 10 may be performed before, after, or between the printings using the CMYK color ink. This holds true for cases in which printing apparatuses other than offset printing apparatuses are used.

In the embodiment described above, an example was given of a configuration in which the ink 10 was used to print a photothermal conversion layer that heats a specific region of the thermal expansion sheet. However, provided that the ink is used to heat a specific region, the ink can be used to form objects other than the photothermal conversion layer.

In the embodiment described above, an example was given of a configuration in which photothermal conversion layers are formed on the front face and the back face of the thermal expansion sheet. However, the present application is not limited thereto. For example, in any embodiment, the photothermal conversion layer may be formed on only the front face or only the back face of the thermal expansion sheet.

In the drawings, the various layers of the thermal expansion sheet, the (front side and back side) photothermal conversion layers, and the color ink layer are exaggerated as necessary to facilitate understanding. Accordingly, the shapes, thicknesses, colors, and other attributes of these layers should not be construed as being limited to the illustrations.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A printing method for printing a photothermal conversion layer for causing expansion of at least a portion of a thermal expansion layer of a thermal expansion sheet, the thermal expansion sheet including the thermal expansion layer and an ink receiving layer configured to receive and hold ink, the printing method comprising:
    printing the photothermal conversion layer on the ink receiving layer using an ink comprising cesium tungsten oxide or lanthanum hexaboride as an inorganic infrared absorbing agent having a higher absorptivity in at least one region of an infrared light spectrum than in a visible light spectrum,
    wherein the photothermal conversion layer is printed such that the ink thereof is received into at least a portion of the ink receiving layer including part of the ink receiving layer on which a color ink layer is to be printed, and
    wherein the photothermal conversion layer is printed such that, after the photothermal conversion layer is printed, a portion of the thermal expansion layer overlaid with the photothermal conversion layer remains covered by the ink receiving layer that has received the ink of the photothermal conversion layer.

2. The printing method according to claim 1, wherein the printing method is inkjet printing, screen printing, gravure printing, offset printing, or flexographic printing.

3. A manufacturing method for manufacturing a shaped object by using a photothermal conversion layer for causing expansion of at least a portion of a thermal expansion layer of a thermal expansion sheet, the thermal expansion sheet including the thermal expansion layer and an ink receiving layer configured to receive and hold ink, the manufacturing method comprising:
    forming the photothermal conversion layer on the ink receiving layer using an ink comprising cesium tungsten oxide or lanthanum hexaboride as an inorganic infrared absorbing agent having a higher absorptivity in at least one region of an infrared light spectrum than in a visible light spectrum, wherein the photothermal conversion layer is printed such that the ink thereof is received into at least a portion of the ink receiving layer including part of the ink receiving layer on which a color ink layer is to be printed, and wherein the photothermal conversion layer is printed such that, after the photothermal conversion layer is printed, a portion of the thermal expansion layer overlaid with the photothermal conversion layer remains covered by the ink receiving layer that has received the ink of the photothermal conversion layer; and
    irradiating the photothermal conversion layer with light in the at least one region of the infrared light spectrum, thereby causing the photothermal conversion layer to generate heat, which causes the portion of the thermal expansion layer overlaid with the photothermal conversion layer to expand, wherein the portion of the thermal expansion layer that is overlaid with the photothermal conversion layer and caused to expand remains covered by the ink receiving layer.

4. The manufacturing method according to claim 3, further comprising:
    printing a color image with the color ink layer on the ink receiving layer,
    wherein the forming of the photothermal conversion layer on the ink receiving layer and the printing of the color image are simultaneous.

5. The manufacturing method according to claim 3, further comprising:
    printing a color image with the color ink layer on the ink receiving layer,
    wherein the printing of the color image is performed prior to the forming of the photothermal conversion layer on the ink receiving layer.

6. The manufacturing method according to claim 3, further comprising:
    printing a color image with the color ink layer on the ink receiving layer, after printing the photothermal conversion layer on the ink receiving layer.

7. The manufacturing method according to claim 6, wherein the printing of the color image is performed after the irradiating of the photothermal conversion layer with light that causes the portion of the thermal expansion layer overlaid with the photothermal conversion layer to expand.

8. The manufacturing method according to claim 7, further comprising:
   printing another photothermal conversion layer on a portion of a side of the thermal expansion sheet opposite from the ink receiving layer.

9. The manufacturing method according to claim 8, further comprising irradiating said another photothermal conversion layer with light, after the color image has been printed, thereby causing the thermal expansion layer to expand again.

\* \* \* \* \*